United States Patent
Zhang et al.

(10) Patent No.: US 8,889,506 B1
(45) Date of Patent: Nov. 18, 2014

(54) STRUCTURE AND METHOD FOR INTERCONNECT SPATIAL FREQUENCY DOUBLING USING SELECTIVE RIDGES

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, Lagrangeville, NY (US); Carl Radens, Lagrangeville, NY (US); Yiheng Xu, Hopewell Junction, NY (US); Edem Wornyo, Danbury, CT (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/931,737

(22) Filed: Jun. 28, 2013

(51) Int. Cl.
H01L 29/94 (2006.01)
H01L 31/062 (2012.01)
H01L 21/768 (2006.01)
H01L 23/522 (2006.01)

(52) U.S. Cl.
CPC ...... *H01L 21/76877* (2013.01); *H01L 23/5226* (2013.01)
USPC ..... 438/207; 438/218; 257/374; 257/E21.546

(58) Field of Classification Search
CPC .................. H01L 21/76877; H01L 23/5226
USPC ................... 438/207, 218; 257/374, E21.546
See application file for complete search history.

(56) References Cited

U.S. PATENT DOCUMENTS

| | | | |
|---|---|---|---|
| 7,994,046 B2 * | 8/2011 | Jeng .............................. | 438/619 |
| 2011/0266685 A1 * | 11/2011 | Chumakov et al. ........... | 257/773 |
| 2013/0207267 A1 * | 8/2013 | Rho .............................. | 257/751 |
| 2013/0210211 A1 * | 8/2013 | Vereen et al. ................. | 438/382 |

* cited by examiner

*Primary Examiner* — Luan C Thai
(74) *Attorney, Agent, or Firm* — Seed IP Law Group PLLC

(57) ABSTRACT

An integrated circuit die includes a semiconductor substrate, a first dielectric layer on the substrate, and a second dielectric layer on the first dielectric layer. Trenches are formed in the first and second dielectric layers. Metal interconnection tracks are formed on sidewalls of the trench on the exposed portions of the second dielectric layer.

20 Claims, 10 Drawing Sheets

STRUCTURE AND METHOD FOR INTERCONNECT SPATIAL FREQUENCY DOUBLING USING SELECTIVE RIDGES

BACKGROUND

1. Technical Field

The present disclosure relates to the field of integrated circuit design. The present disclosure relates more particularly to formation of metal interconnections within an integrated circuit die.

2. Description of the Related Art

As integrated circuit technology continues to scale down to smaller technology nodes, the back end of the line connections become very challenging and complicated to implement. Complex patterning schemes such as double patterning are used to provide smaller and smaller interconnection features. Many problems can occur within the integrated circuits as vias and metal lines within the integrated circuit become smaller and closer together. These problems can include difficulty in alignment of photolithography masks during manufacture, as well as electromigration and time dependent dielectric breakdown during the life of the integrated circuit.

BRIEF SUMMARY

One embodiment is an integrated circuit die including a semiconductor substrate, a first dielectric layer on the semiconductor substrate, and a second dielectric layer of a different dielectric material on the first dielectric layer. A relatively wide trench is positioned in the first and second dielectric layers. A conductive seed layer is positioned on exposed portions of the second dielectric layer on both sidewalls of the trench. The respective materials of the first and second dielectric layers and the conductive seed layer are selected such that during growth of the seed layer, the seed layer selectively accumulates on the second dielectric layer but not on the first dielectric layer. The seed layer therefore includes two electrically isolated portions on opposing sidewalls of the trench.

A second conductive material is positioned on the first conductive material. The integrated circuit die therefore includes two electrically isolated metal interconnection tracks on opposing sidewalls of the trench. Each metal interconnection track includes respective portions of both the conductive seed layer and the second conductive material.

A single wide trench is used to form two metal interconnection tracks. The single wide trench is formed using a single photolithography mask. The photolithography requirements for forming the metal interconnection tracks are therefore relaxed in comparison to previous processes for forming metal interconnection tracks.

One embodiment is a method for forming metal interconnection tracks in an integrated circuit die. The method includes etching a trench through a first dielectric layer and a second dielectric layer of different materials. A conductive seed layer is grown on the exposed portions of the second dielectric layer in the trench. The respective materials of the first and second dielectric layers and the conductive seed layer are selected such that during growth of the seed layer, the seed layer selectively accumulates on the second dielectric layer but not on the first dielectric layer. Because the conductive seed layer grows only on the exposed portions of the second dielectric layer and not on the exposed portions of the first dielectric layer, the conductive seed layer does not grow on the bottom of the trench. The portions of the conductive seed layer on the second dielectric material on opposing sidewalls of the trench are electrically isolated from each other. A second conductive material is then grown on the portions of the conductive seed layer on opposing sidewalls of the trench, thereby forming two electrically isolated metal interconnection tracks on opposing sidewalls of the trench.

In this manner, a single wide trench etch can be used to form two metal interconnection tracks. This effectively doubles the spatial frequency at which metal interconnection tracks can be formed because the smallest structures that can be formed using photolithography techniques can now each provide two separate metal interconnection tracks.

DETAILED DESCRIPTION

Figure 1:
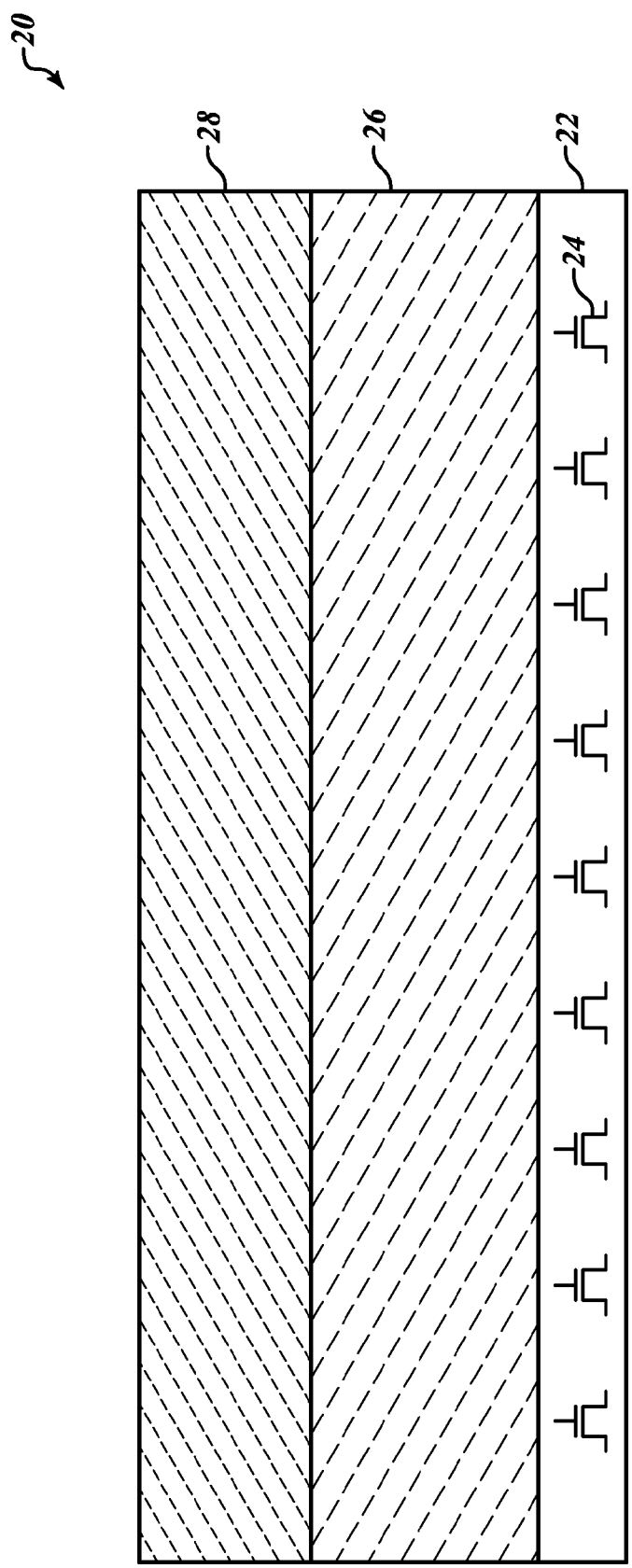
FIG. 1 is a cross-section of an integrated circuit die including a semiconductor substrate and dielectric layers according to one embodiment.

FIG. 1 is a cross-section of an integrated circuit die 20. The integrated circuit die 20 includes a semiconductor substrate 22 in which transistors 24 have been formed. A first dielectric layer 26 is positioned on the semiconductor substrate 22. A second dielectric layer 28 is positioned on the first dielectric layer 26.

In one embodiment, the materials of the first and second dielectric layers 26, 28 are selected such that a seed layer of conductive material can be selectively grown on the second dielectric layer 28 without growing on the first dielectric layer 26.

In one example, the first dielectric layer 26 is silicon nitride about 20-100 nanometers thick. The second dielectric layer 28 is silicon oxide about 20-100 nanometers thick. Of course, many other materials and thicknesses for the first and second dielectric layers 26, 28 can be chosen without departing from the scope of the present disclosure.

Due to the particular properties of silicon nitride and silicon oxide, many conductive materials can be grown on exposed portions of one without growing on exposed portions of the other. This can be very helpful in forming metal interconnection tracks as will be described in more detail below.

Figure 2:
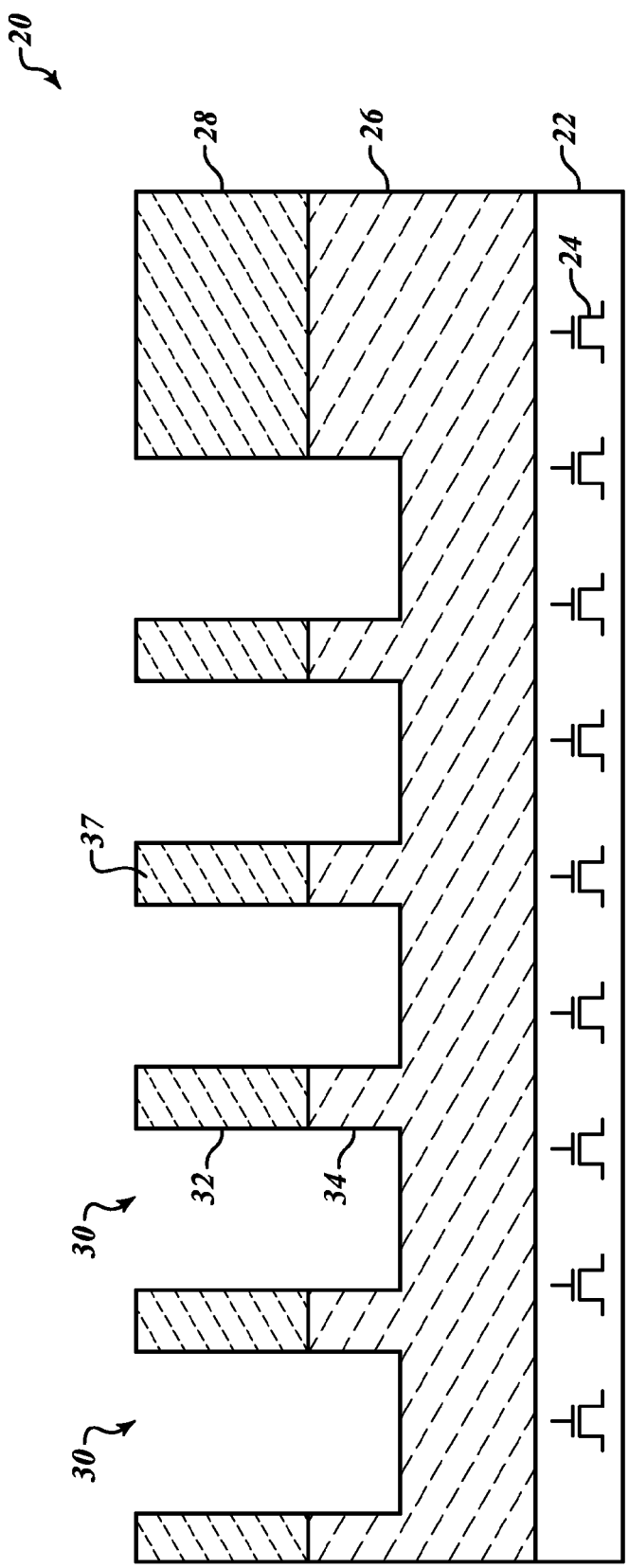
FIG. 2 is a cross-section of an integrated circuit die in which trenches have been etched in the dielectric layers according to one embodiment.

In FIG. 2, trenches 30 have been etched in the first and second dielectric layers 26, 28. The trenches 30 have a width of about 50-100 nm. The trenches 30 have been etched all the way through the second dielectric layer 28 but have only been etched partially through the first dielectric layer 26. The sidewalls of the trench include exposed portions 32 of the second dielectric layer 28 and exposed portions 34 of the first dielectric layer 26. Because the trenches have only been etched partially through the first dielectric layer 26, the first dielectric layer 26 is at the bottom of the trenches 30.

In one embodiment the trenches 30 are patterned and etched using conventional photolithography processes and reactive ion etching (RIE). For example, a photolithography mask can be formed by depositing silicon nitride on the surface of the second dielectric layer 28. Photoresist can be deposited in liquid form by a spin on process. In a spin on process, a certain amount of liquid photoresist is placed on the integrated circuit die 20 and the whole integrated circuit die 20 is rotated rapidly causing the liquid photoresist to spread outward to cover the entire integrated circuit die 20. The liquid photoresist is then cured and hardened. A mask is then placed over the integrated circuit die 20 having a pattern corresponding to the pattern of the trenches 30 in FIG. 2. The mask is then irradiated with ultraviolet light which is allowed to pass through the mask to irradiate the photoresist according to the pattern of the mask. The irradiated portions of the photoresist undergo a chemical change causing the irradiated portions of the photoresist to be selectively stripped away. The integrated circuit die 20 is then subjected to an RIE etch which etches the trenches 30 as shown in FIG. 2. In the reactive ion etching process, chemically reactive plasma is used to remove material from the first and second dielectric layers 26, 28. The plasma is generated in a vacuum by an intense electromagnetic field. High-energy ions are directed towards the integrated circuit die 20, reacting with and etching it. Because the plasma comes toward the integrated circuit die 20 at normal incidence, RIE produces a very anisotropic etch profile. Using advanced process control (APC) the depth of the trenches 30 can be very precisely controlled. In some processes it is useful to use an atomic force microscope (AFM) to measure the depth of the trenches 30 after an etch to be able to determine how long the etch should take place in order to achieve the desired depth.

Figure 3:
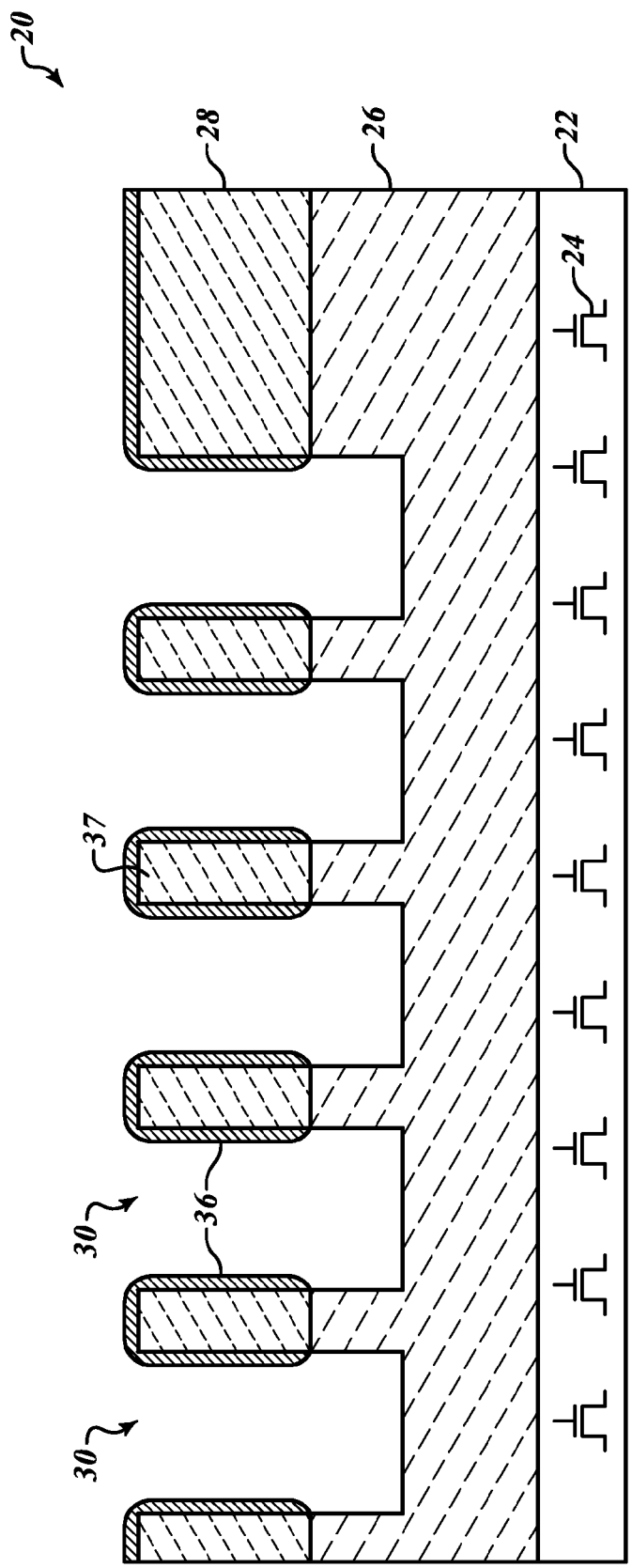
FIG. 3 is a cross-section of an integrated circuit die in which a conductive seed layer has been formed on one of the dielectric layers according to one embodiment.

In FIG. 3 a thin conductive seed layer 36 has been grown on the exposed portions of the second dielectric material 28 on the sidewalls of the trenches 30. In one example the seed layer 36 is 2-20 nm thick.

As described previously the material of the seed layer 36 is selected so that it will accumulate on the exposed portions of the second dielectric layer 28 but not on the exposed portions of the first dielectric layer 26. This ensures that on opposing sidewalls of each trench 30, respective portions of the seed layer 36 will remain electrically isolated from each other because the seed layer 36 has not accumulated on the exposed portions of the first dielectric layer 26.

In an example in which the first dielectric layer 26 is silicon nitride and the second dielectric layer 28 is silicon oxide, the material for the conductive seed layer is selected such that it will grow on silicon oxide but not on silicon nitride.

In one embodiment, the conductive seed layer 36 is a manganese seed layer. The manganese seed layer can be deposited by a chemical vapor deposition process. In a chemical vapor deposition process manganese material reacts with, bonds to, and accumulates on the exposed portions of the silicon oxide layer 28. The manganese material does not accumulate on the silicon nitride layer 26. Of course, other materials can be chosen for the seed layer 36 as well, such other materials include cobalt, ruthenium, or any conductive material that will selectively grow on one dielectric layer but not another.

In the event some small amount of seed layer accumulates on dielectric layer 26, there can be removed by a blanket wet etch while leaving sufficient material on the sidewalls of layer 28 to be the seed layer 36.

In one embodiment, it only needed that the seed layer 36 accumulated much faster on layer 36 accumulated much faster on layer 28 than on layer 26. Thus, if the seed layer 36 builds up 3 to 4 times faster on layer 28 than on layer 26, the deposition continues until the seed layer 36 and dielectric layer 28 is about twice as thick as needed. A blanket etch, such as a blanket wet etch that is isotropic is performed to remove all the seed layer material 36 on the dielectric layer 26 while leaving a sufficient thickness on layer 28 to provide for the electroplating step that follows.

Figure 4:
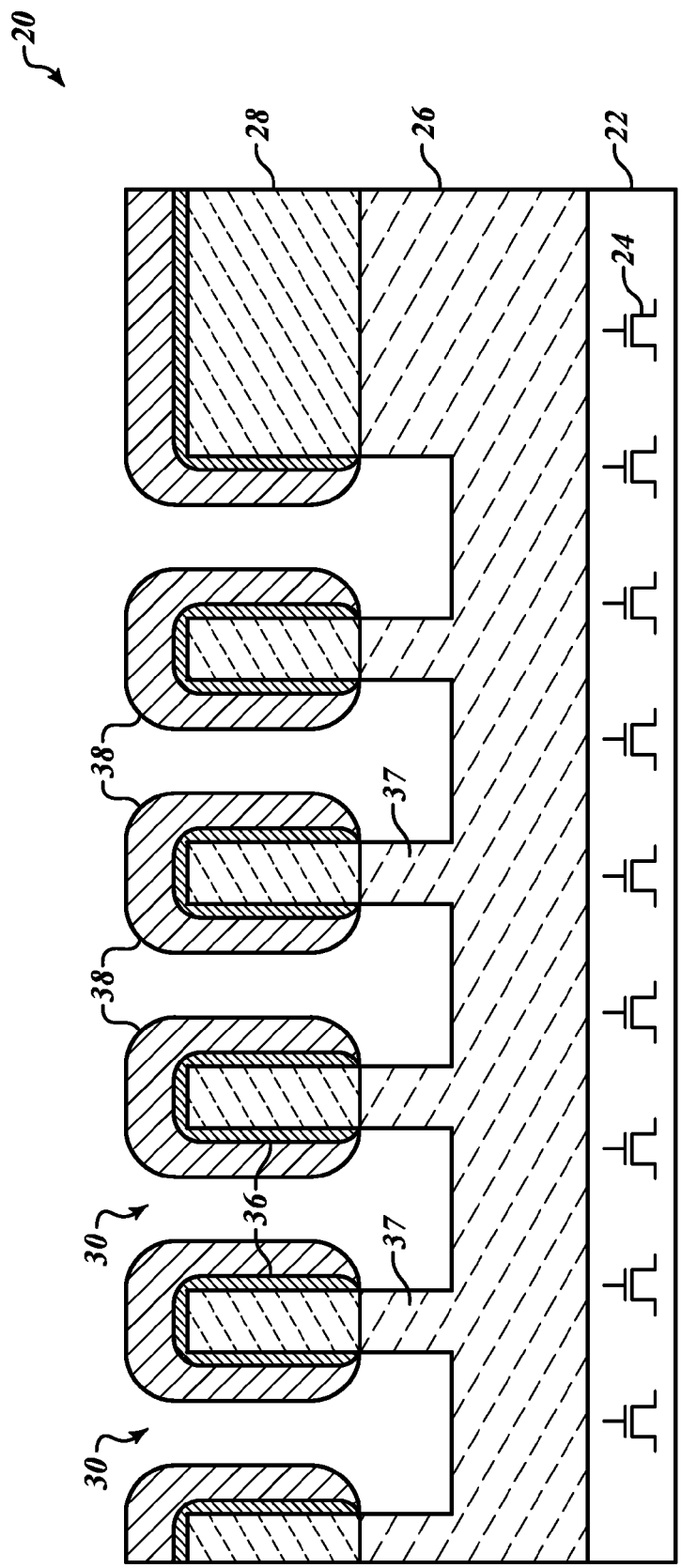
FIG. 4 is a cross-section of an integrated circuit die in which a second conductive layer has been formed on the conductive seed layer according to one embodiment

In FIG. 4 a second conductive material 38 has been deposited on the conductive seed layer 36. The second conductive material 38 is deposited in a process that allows it to accumulate on the conductive seed layer 36 but not on the exposed portions of the first dielectric layer 26.

In one example, the second conductive material 38 is copper. The copper is about 10-50 nm thick. In order to ensure that the copper accumulates only on the conductive seed layer 36 and not on the exposed portions of the first dielectric layer 26, an electroplating process is used to grow the copper on the conductive seed layer 36. In an electroplating process a metal cathode is held in a solution at a negative voltage with respect to an anode that is also in the solution. Copper from the anode dissolves in the solution and is drawn to the cathode. In this case the cathode is the seed layer 36. Copper is therefore drawn to the seed layer 36 and accumulates thereon without accumulating on the exposed portions of the first dielectric layer 26.

Copper lines are formed as interconnect lines on pillars 37 as shown in FIG. 4. These copper lines perform the same function as the standard interconnect lines in the prior art, such as metal 1 or metal 2. With this technique, the metal interconnect lines extend vertically along the pillars 37 instead of on top of the dielectric layer 28. This permits the lines to be placed closer to each other than photolithographic dimensions permit. The height of pillars 37 of dielectric layer 28 is selected to provide very high conductivity and low resistance for the interconnect lines 38. If lower resistance is desired, the pillars can be made taller. Further, if less capacitance interaction between adjacent interconnect lines 38 is desired, the pillars 37 can be made further apart from each other.

Figure 5:
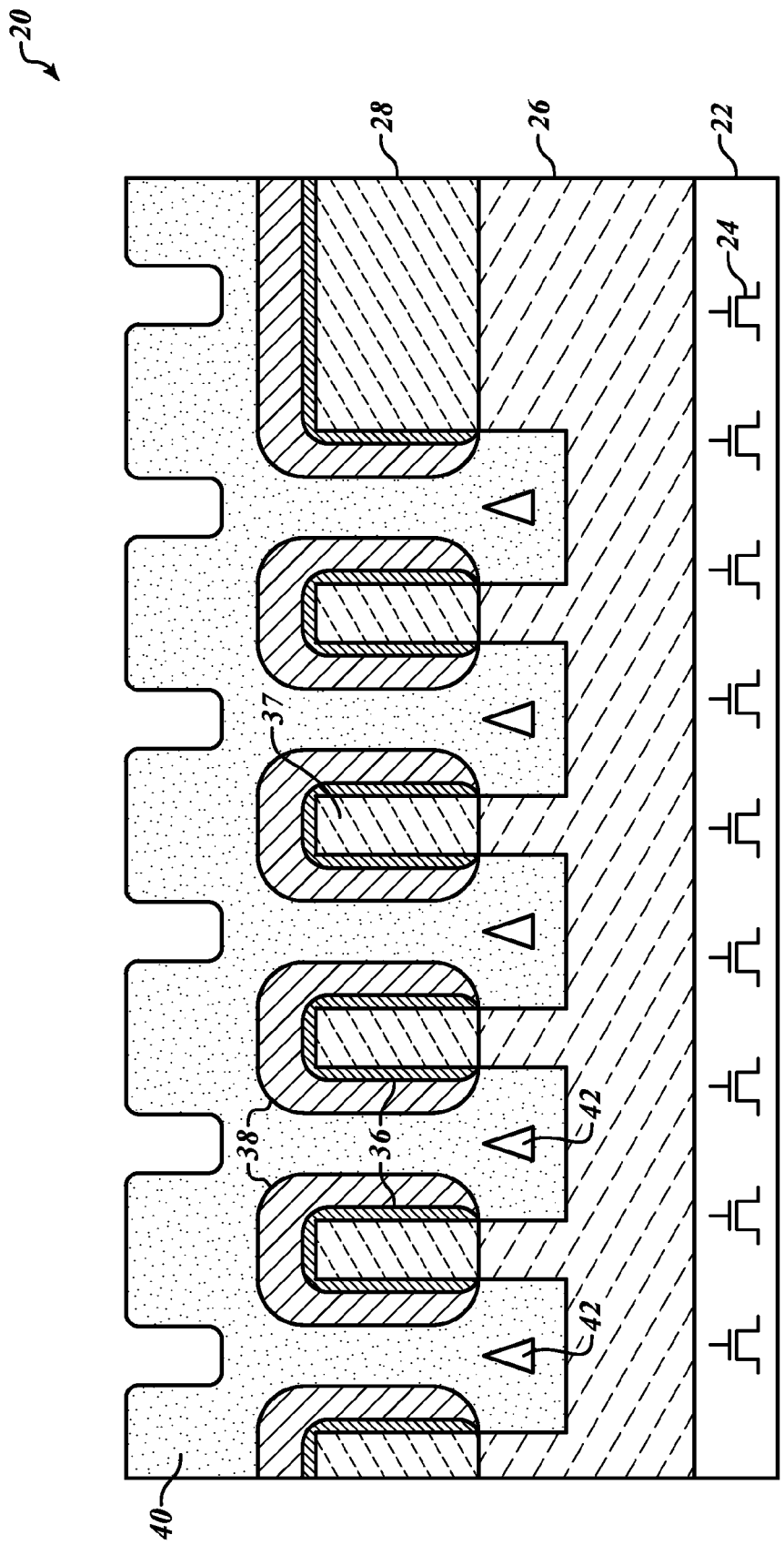
FIG. 5 is a cross-section of an integrated circuit die in which a low k dielectric has been deposited in the trenches according to one embodiment.

In FIG. 5 a dielectric material 40 has been deposited in the trenches 30 and on the second conductive material 38. In one example, the dielectric material 40 is a low K dielectric material. The choice of a low K dielectric material helps to reduce the capacitance between opposing portions of the second conductive material 38.

It is possible that air gaps 42 will form in the low K dielectric material 40. In one embodiment the dimensions of the trenches 30 and conductive materials 36, 38 can be chose such that air gaps 42 are positioned between the opposing portions of the second conductive material 38 in the trenches 30. This would further reduce the capacitance between the respective portions of the second conductive material 38.

Figure 6:
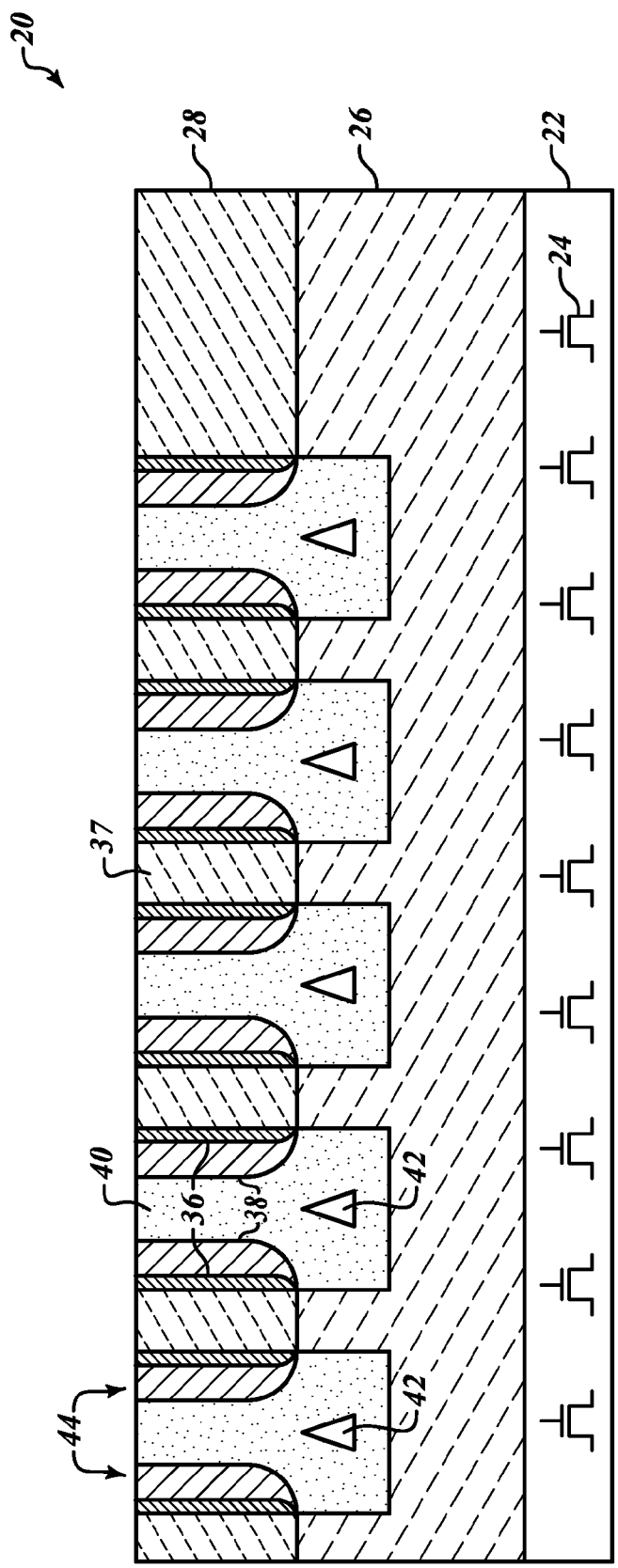
FIG. 6 is a cross-section of an integrated circuit die in which the dielectric layers and conductive layers have been planarized according to one embodiment.

In FIG. 6 a chemical mechanical planarization process (CMP) has been performed in which the top surface of the integrated circuit die 20 has been planarized. The planarization step removes excess portions of the low K dielectric material 40 from the top of the integrated circuit die 20. The planarization process also removes excess portions of the conductive seed layer 36 and the second conductive layer 38 from the top of the second dielectric layer 28. The planarization process therefore defines the top surface of metal tracks 44 on opposing sides of each respective trench 30. Because the seed layer 36 and the second conductive layer 38 have been removed from the top surface of the second dielectric layer 28, all metal tracks 44 are electrically isolated from each other. Each metal track 44 includes a respective portion of the seed layer 36 and a respective portion of the second conductive layer 38.

In one example, the chemical mechanical planarization process can be programmed to stop once the second dielectric layer 28 has been reached. This ensures that all of the metal interconnection tracks 44 will be electrically isolated from each other because no portions of the seed layer 36 and the second conductive layer 38 remain on the top surface of the second dielectric layer 28.

In one example, the trenches 30 are 100 nm wide and the second conductive layer 38 is 32 nm thick. This leaves a gap of about 36 nm between opposing portions of the second conductive layer 38 in the trenches 30. The thickness to which copper is plated will only be limited by the distance between the pillars 37 and avoiding contact with an adjacent track. In this example the photolithography requirements are relaxed as 100 nm wide features in a photolithography mask are relatively easily made. Each 100 nm wide trench 30 results in two opposing metal tracks 44. Thus, metal tracks 44 formed according to principles of the present disclosure advantageously reduce photolithography requirements as well as mask alignment requirements.

Viewed from another point, the spacing between adjacent metal tracks is now defined by the height to which copper is plated onto the pillars 37. The spacing between them is no longer limited by photolithographic dimensions and can be made much closer if desired. The spacing between adjacent pillars 37 and the width of each pillar can be based on the minimum photolithographic dimensions available so that when the copper layer is plated thereon, even higher densities and closer spacing can be achieved.

While the foregoing process has been described as forming metal interconnection tracks 44, those of skill in the art will recognize that principles of the present disclosure can be utilized to form a large number of structures other than metal interconnection tracks 44. For example, the principles of the present disclosure can be used to form capacitors, resistors, fuses, efuses, anti-fuses etc. Normally it will be desired to avoid capacitive interaction between adjacent copper tracks that face each other and the spacing will be sufficient to reduce this effect. In some designs, it may be desirable to create a capacitor, in which case the copper is plated to a very small gap and air or a vacuum is left between them as the dielectric constant. This will provide a very high capacitance value since air as the dielectric material results in a high quality capacitor. Additionally, principles of the present disclosure can be used to form finFET devices including tri gate or double gate transistors. In such an example the second dielectric layer 28 will be replaced with a semiconductor layer such as silicon. The first dielectric layer 26 would be silicon oxide. While such processes and structures are not described with particularity herein, those of skill in the art will understand how the structures can be made utilizing principles of the present disclosure. All such other processes and structures fall within the scope of the present disclosure.

In yet another example, the second dielectric layer 28 can be replaced with a conductive layer such as TiN. In such an example, the remaining portions of the layer 28 (in this case of a conductive material) are themselves the metal interconnection tracks 44.

Figure 7:
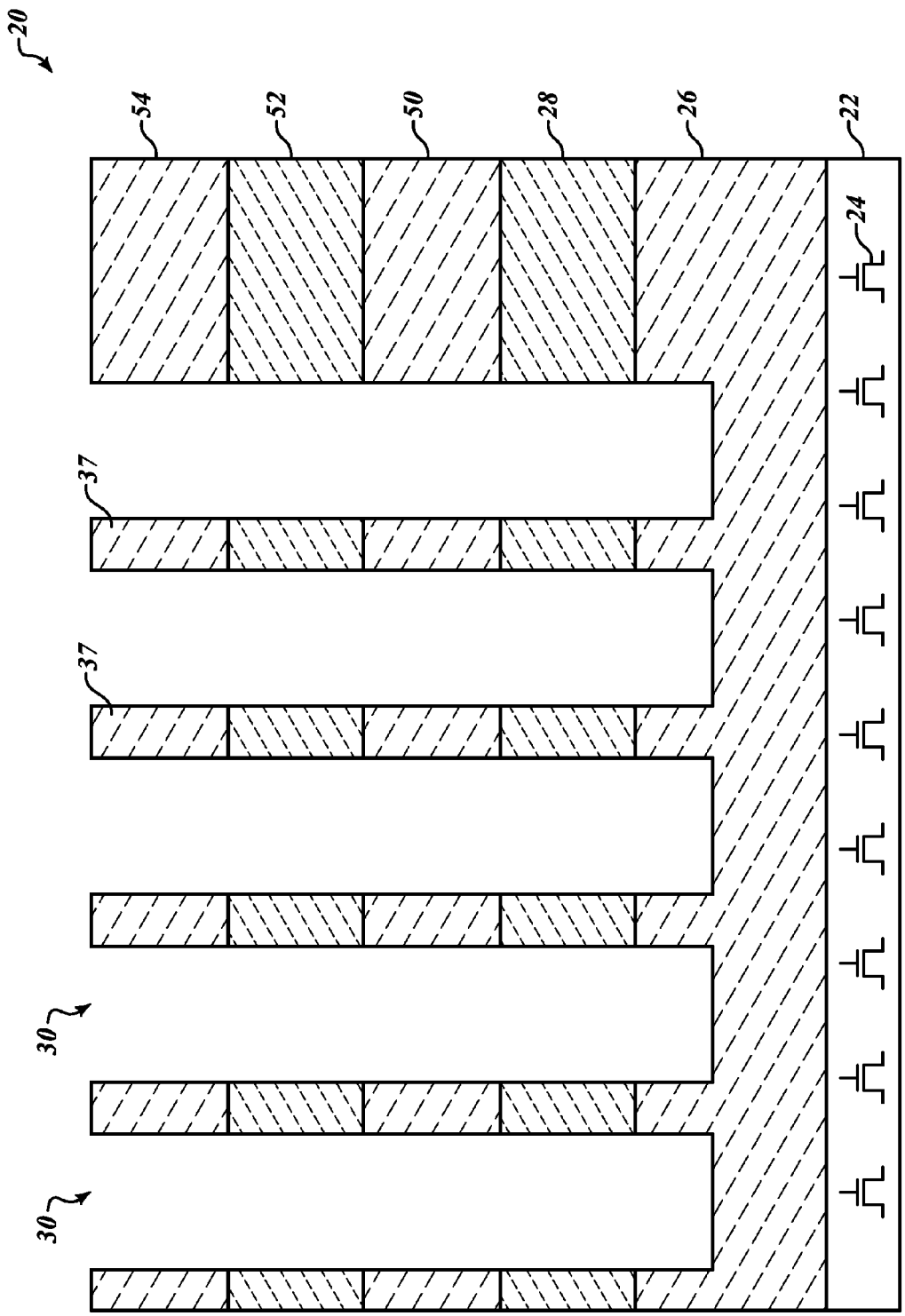
FIG. 7 is a cross-section of an integrated circuit die including a semiconductor substrate and a plurality of dielectric layers in which trenches have been etched according to one embodiment.

FIG. 7 illustrates an integrated circuit die 20 according to one embodiment. The integrated circuit die 20 of FIG. 7 includes a semiconductor substrate 22 in which transistors 24 have been formed. The first dielectric layer 26 is positioned on the semiconductor substrate 22. A second dielectric layer 28 is positioned on the first dielectric layer 26. A third dielectric layer 50 is positioned on the second dielectric layer 28. A fourth dielectric layer 52 is positioned on the third dielectric layer 50. A fifth dielectric layer 54 is positioned on the fourth dielectric layer 52.

In one embodiment, the materials of the first, third, and fifth dielectric layers 26, 50, 54, are the same. The materials of the second and fourth dielectric layers 28, 52 are also the same.

In one embodiment, the materials of the first, second, third, fourth, and fifth dielectric layers 26, 28, 50, 52, 54 are selected such that a seed layer of conductive material can be selectively grown on the second and fourth dielectric layers 28, 52 without growing on the first, third, and fifth dielectric layers 26, 50, 54.

In one example, the first, third, and fifth dielectric layers 26, 50, 54 are silicon nitride about 20-100 nanometers thick. The second and fourth dielectric layers 28, 52 are silicon oxide about 20-100 nanometers thick. Of course, many other materials and thicknesses for the first, second, third, fourth, and fifth dielectric layers can be chosen without departing from the scope of the present disclosure.

Due to the particular properties of silicon nitride and silicon oxide, many conductive materials can be grown on exposed portions of one without growing on exposed portions of the other. This can be very helpful in forming metal interconnection tracks as discussed previously.

Trenches 30 have been etched in the first, second, third, fourth, and fifth dielectric layers 26, 28, 50, 52, 54. The trenches 30 have a width of about 50-100 nm. The trenches 30 have been etched all the way through the second, third, fourth, and fifth dielectric layers 28, 50, 52, 54, but have only been etched partially through the first dielectric layer 26. Because the trenches have only been etched partially through the first dielectric layer 26, the material of the first dielectric layer 26 is at the bottom of the trenches 30.

Figure 8:
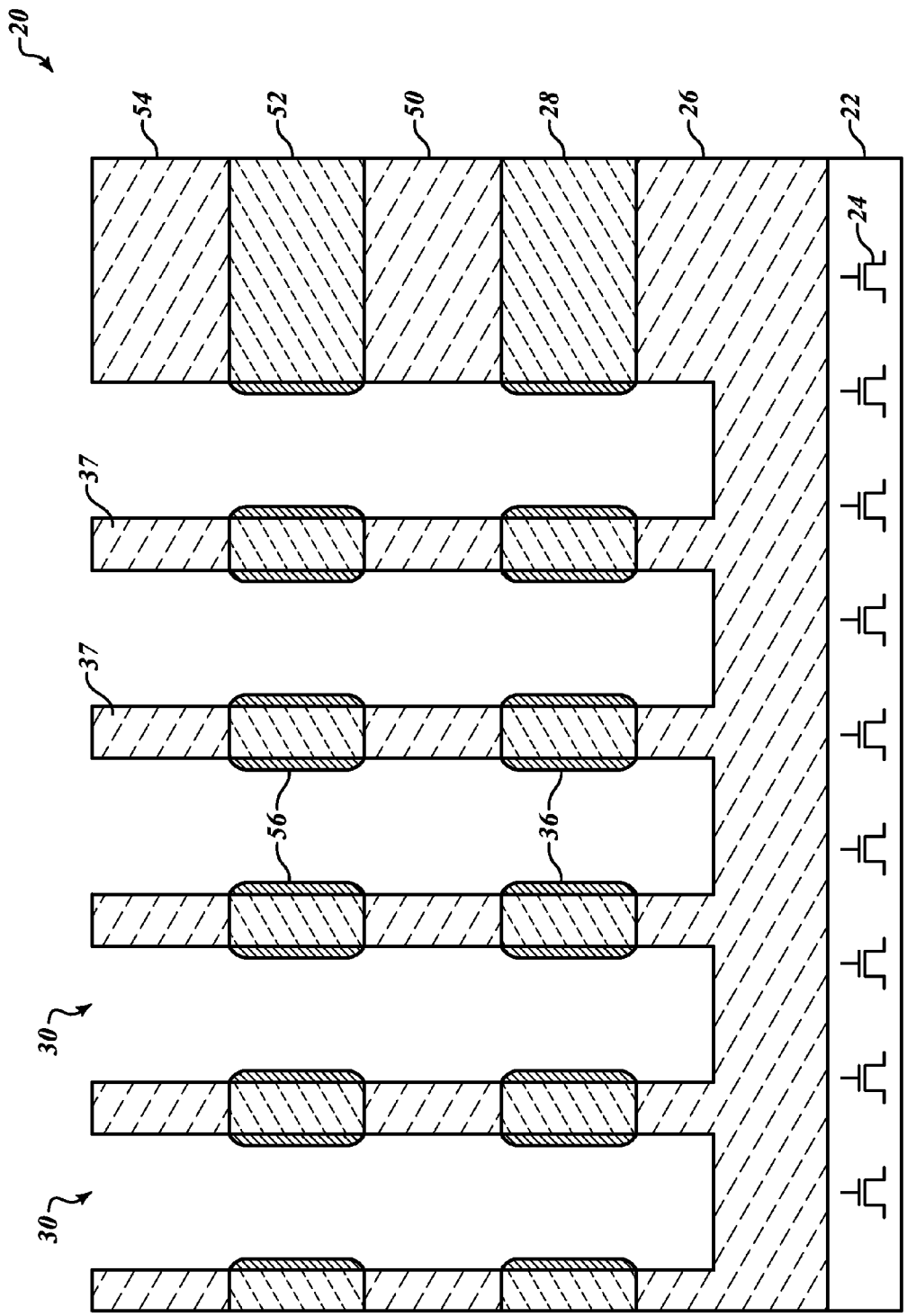
FIG. 8 is a cross-section of an integrated circuit die in which a conduct a seed layer is grown on two of the dielectric layers according to one embodiment

In FIG. 8 a thin conductive seed layer 36 has been grown on the exposed portions of the second dielectric material 28 on the sidewalls of the trenches 30. A thin conductive seed layer 56 has also been grown on exposed portions of the fourth dielectric layer 52. The seed layers 36, 56 are formed simultaneously in a single deposition step. In one example the seed layers 36, 56 are about 2-20 nm thick.

As described previously the material of the seed layers 36 and 56 are selected so that it will accumulate on the exposed portions of the second and fourth dielectric layers 28, 52, but not on the exposed portions of the first, third, and fifth dielectric layers 26 50, 54. In one example, the seed layers 36, 56 are manganese, ruthenium, or cobalt.

Figure 9:
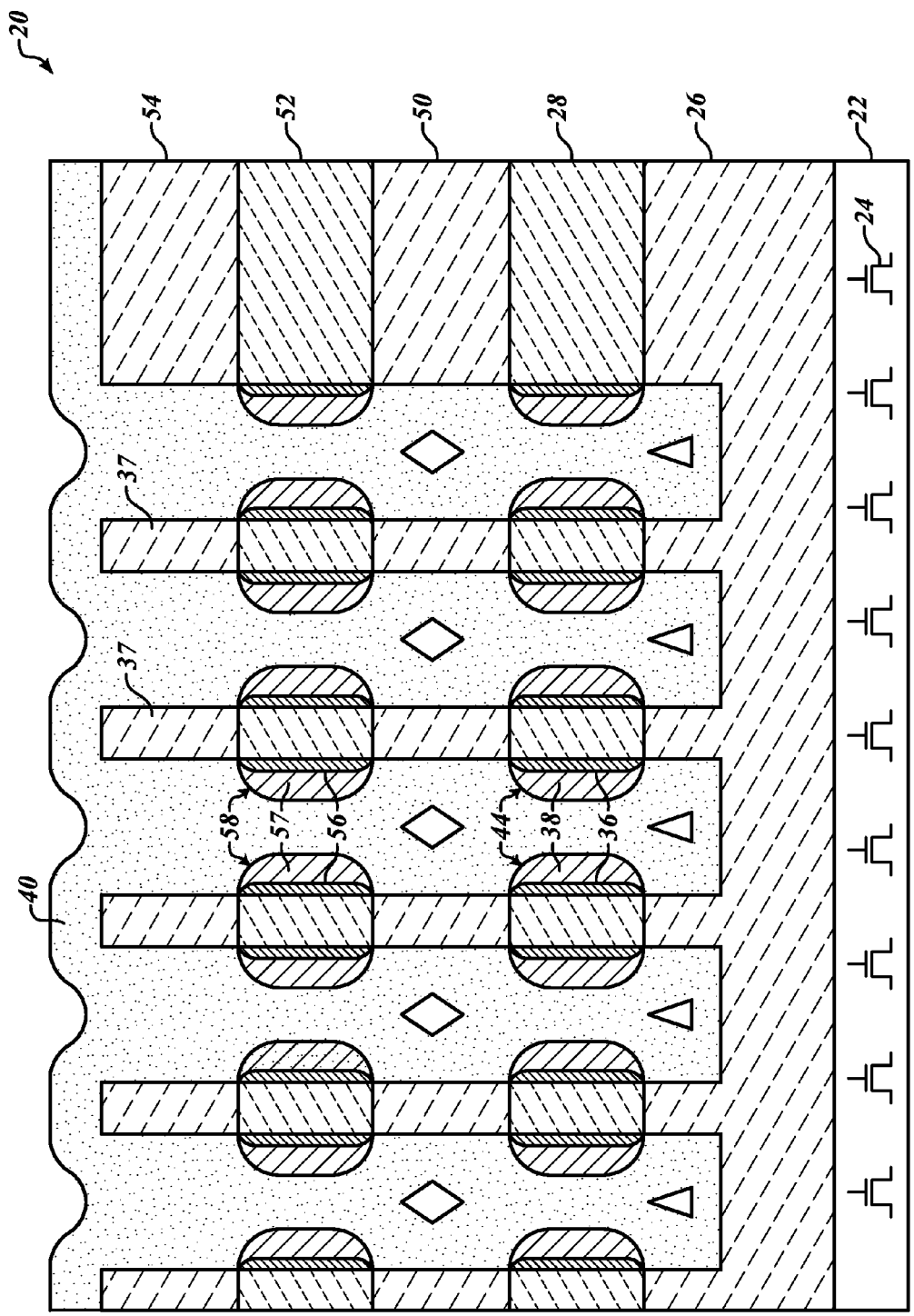
FIG. 9 is a cross-section of an integrated circuit die in which a second conductive layer has been formed on the seed layers and the trenches have been filled with a low k dielectric according to one embodiment.

In FIG. 9 a second conductive material 38, 57 has been grown on respective portions of the first and second seed layers 36, 56. The second conductive material is deposited in a process that allows it to accumulate on the conductive seed layers 36 and 56 but not on the exposed portions of the first, third, and fifth dielectric layers 26, 50, 54.

In one example, the second conductive material is copper. The copper is 10-50 nm thick. In order to ensure that the copper accumulates only on the conductive seed layers 36 and 56 and not on the exposed portions of the first, third, and fifth dielectric layers 26, 50, 54 an electroplating process is used to grow the copper on the conductive seed layers 36, 56. In an electroplating process a metal cathode is held in a solution at a negative voltage with respect to a copper anode in the solution. Copper from the anode dissolves in the solution and is drawn to the cathode. In this case, the cathode includes the seed layers 36, 56. Copper is therefore drawn to the seed layers 36, 56 and accumulates thereon without accumulating on the exposed portions of the first, third, and fifth dielectric layers 26, 50, 54.

Together, the respective portions of the seed layer 36 and the second layer of conductive material 38 form electrically isolated metal interconnection tracks 44. The respective portions of the seed layer 56 and the second layer of conductive material 57 57 form electrically isolated second metal interconnection tracks 58.

With a single photolithography step trenches 30 have been etched through five dielectric layers 26, 28, 50, 52, 54. From this single trench etch, first and second metal interconnection tracks 44 and 58 have been formed on sidewalls of the trenches 30. Not only has this been done with a single photolithography step, but the requirements of the photolithography step are relaxed with respect to previous processes for forming metal interconnection tracks.

Figure 10:
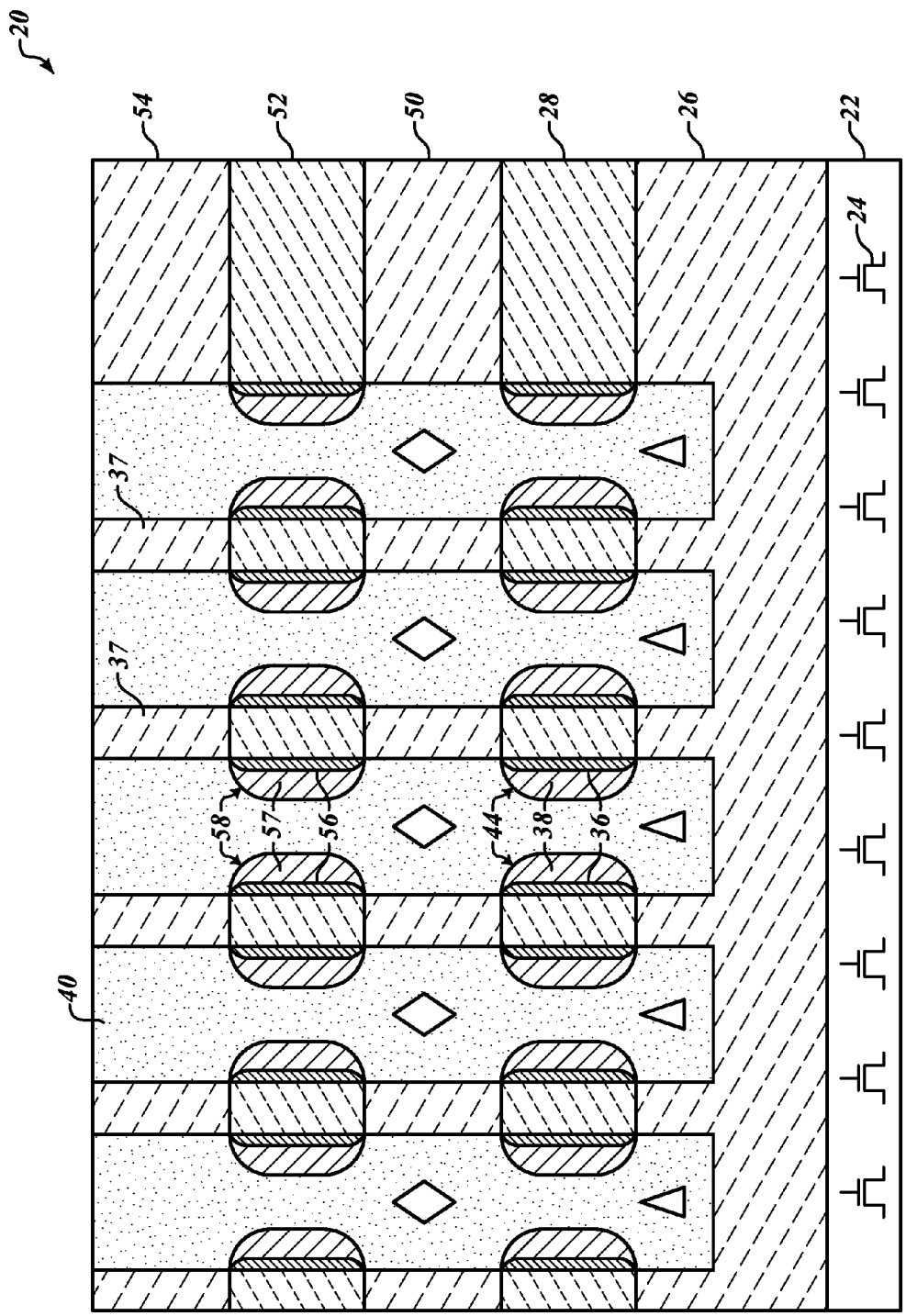
FIG. 10 is a cross-section of an integrated circuit die after the dielectric layers have been planarized according to one embodiment.

In FIG. 10 a chemical mechanical planarization process (CMP) has been performed in which the top surface of the integrated circuit die 20 has been planarized. The planarization step removes excess portions of the low K dielectric material 40 from on top of the integrated circuit die 20. Each metal track 44 includes a respective portion of the seed layer 36 and a respective portion of the second conductive layer 38.

In one example the chemical mechanical planarization process can be programmed to stop once the fifth dielectric layer 54 has been reached. This ensures that all the fifth dielectric layer 54, and the low K dielectric layer 40 will have a planar top surface subsequent processing steps can be performed easily.

The process described with relation to FIGS. 7 to 10 can be repeated to form additional levels of metal interconnections and dielectric layers. Furthermore, though not described in the foregoing description, contact vias can be formed to connect the metal interconnection tracks of one level with the metal interconnection tracks in a higher or lower level, with contact pads at a surface of the integrated circuit die 20, or with the transistors 24 at the silicon substrate 22.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for forming an integrated circuit die, the method comprising:
    depositing a first dielectric layer of a first dielectric material overlying a semiconductor substrate;
    depositing a second dielectric layer of a second dielectric material overlying the first dielectric layer;
    etching a plurality of trenches in the first and second dielectric layers; and
    forming first metal interconnection lines on exposed portions of the second dielectric material in the trenches by depositing a first conductive material into the trenches, the first conductive material configured to accumulate on the exposed portions of the second dielectric material in the trenches and to not accumulate on exposed portions of the first dielectric material in the trenches.

2. The method of claim 1 wherein the first dielectric material includes silicon nitride and the second dielectric material is silicon oxide.

3. The method of claim 1 wherein the first conductive material is selected from a group consisting of manganese, cobalt, and ruthenium.

4. The method of claim 1 wherein forming the metal interconnection lines further comprises depositing a second conductive material into the trenches, the second conductive material configured to accumulate on the first conductive material and to not accumulate on the exposed portions of the first dielectric material in the trenches.

5. The method of claim 4 wherein the second metal is copper.

6. The method of claim 1 comprising depositing a third dielectric material into the trenches, the third dielectric material in each trench separating respective metal interconnection lines in the trench.

7. The method of claim 1 further comprising:
    depositing a third dielectric layer of the first dielectric material on the second dielectric layer; and
    depositing a fourth dielectric layer of the second dielectric material on the third dielectric layer.

8. The method of claim 7 wherein etching the plurality of trenches includes etching through the first, second, third, and fourth dielectric layers.

9. The method of claim 8 comprising forming second metal interconnection lines on exposed portions of the fourth dielectric layer in the trenches by depositing the first conductive material into the trenches, the first conductive material configured to accumulate on the exposed portions of the fourth dielectric layer in the trenches and to not accumulate on exposed portions of the third dielectric layer in the trenches.

10. The method of claim 1 comprising planarizing a top surface of the second dielectric layer.

11. An integrated circuit die comprising:
    a semiconductor substrate;
    a first dielectric layer overlying the substrate;
    a second dielectric layer overlying the first dielectric layer;
    a trench in the first and second dielectric layers; and
    first and second interconnection lines in the trench on opposing sidewalls of the trench, the first and second interconnection lines being positioned on respective exposed portions of the second dielectric layer in the trench and not positioned on respective exposed portions of the first dielectric layer in the trench.

12. The integrated circuit die of claim 11 comprising:
    a third dielectric layer overlying the second dielectric layer;

a fourth dielectric layer overlying the third dielectric layer, the trench extending through the third and fourth dielectric layers; and third and fourth metal interconnection lines on the opposing sidewalls of the trench above the first and second interconnection lines, the first and second interconnection lines being positioned on respective exposed portions of the fourth dielectric layer in the trench and not positioned on respective exposed portions of the third dielectric layer in the trench.

13. The integrated circuit die of claim 12 wherein the first and third dielectric layers are of a first dielectric material and the second and fourth dielectric layers are of a second dielectric material.

14. The integrated circuit die of claim 11 wherein the first dielectric layer is silicon nitride and the second dielectric layer is silicon oxide.

15. The integrated circuit die of claim 14 wherein the first and second metal interconnection lines include a first conductive material selected from a group consisting of manganese, cobalt, and ruthenium.

16. The integrated circuit die of claim 15 wherein the first and second metal interconnection lines further include copper.

17. A method comprising:
depositing a first dielectric layer overlying a semiconductor substrate;
depositing a second dielectric layer on the first dielectric layer;
etching a trench in the first and second dielectric layers; and forming a first and a second interconnection line in the trench on opposing sidewalls of the trench, the first and second interconnection lines being positioned on respective exposed portions of the second dielectric layer in the trench and not positioned on respective exposed portions of the first dielectric layer in the trench.

18. The method of claim 17 comprising forming the first and the second interconnection lines by depositing a first conductive material into the trench, the first conductive material configured to accumulate on the exposed portions of the second dielectric layer in the trench and to not accumulate on exposed portions of the first dielectric layer in the trench.

19. The method of claim 17 comprising filling the trench with a dielectric material, the dielectric material being positioned between the first and the second interconnection lines.

20. The method of claim 17 comprising:
forming a third dielectric layer overlying the second dielectric layer;
forming a fourth dielectric layer overlying the third dielectric layer;
etching the trench through the third and fourth dielectric layers; and
forming third and fourth metal interconnection lines on the opposing sidewalls of the trench above the first and second interconnection lines, the first and second interconnection lines being positioned on respective exposed portions of the fourth dielectric layer in the trench and not positioned on respective exposed portions of the third dielectric layer in the trench.

* * * * *